United States Patent [19]

Byers et al.

[11] Patent Number: 4,933,908

[45] Date of Patent: Jun. 12, 1990

[54] FAULT DETECTION IN MEMORY REFRESHING SYSTEM

[75] Inventors: Larry L. Byers, Apple Valley; Wayne A. Michaelson, Circle Pines, both of Minn.; Richard F. Paul, Houghton, Mich.

[73] Assignee: Unisys Corporation, Blue Bell, Pa.

[21] Appl. No.: 264,113

[22] Filed: Oct. 28, 1988

[51] Int. Cl.$^5$ .......................... G11C 7/00; G11C 29/00
[52] U.S. Cl. ............................... 365/222; 365/230.02; 365/236; 365/200; 371/68.1; 371/8.2
[58] Field of Search ........... 365/222, 200, 201, 230.02, 365/236, 210; 371/21, 68, 48, 8.1, 8.2, 68.1

[56] References Cited

U.S. PATENT DOCUMENTS

| | | | |
|---|---|---|---|
| 3,944,800 | 3/1976 | Beck et al. | 371/68 |
| 4,185,323 | 1/1980 | Johnson et al. | 365/222 |
| 4,701,843 | 10/1987 | Cohen | 365/222 |

*Primary Examiner*—Glenn A. Gossage

*Attorney, Agent, or Firm*—Glenn W. Bowen; Robert S. Bramson

[57] ABSTRACT

A dynamic random access memory (DRAM) memory refreshing scheme utilizes at least two separate refresh channels. Each of the channels consists of a pair of identical counters which are coupled through two different types of timing chains. One of the timing chains is associated with one of the counters and generates a refresh request signal, while the other timing channel generates a refresh error signal. As long as the refresh error signal matches the refresh request signal, no error is present, and a validated refresh request signal will be generated from that timing channel and supplied to an OR gate to refresh all of the memory banks for the memory. Whenever a mismatch occurs between the refresh error signal and the refresh request for one of the refresh channels, the validated refresh request signal for that channel will be inoperable, and continued refreshing operation of the memory depends on the supply of the validated refresh request signals through the other channel in which the refresh request signal and the refresh error signals still match.

7 Claims, 3 Drawing Sheets

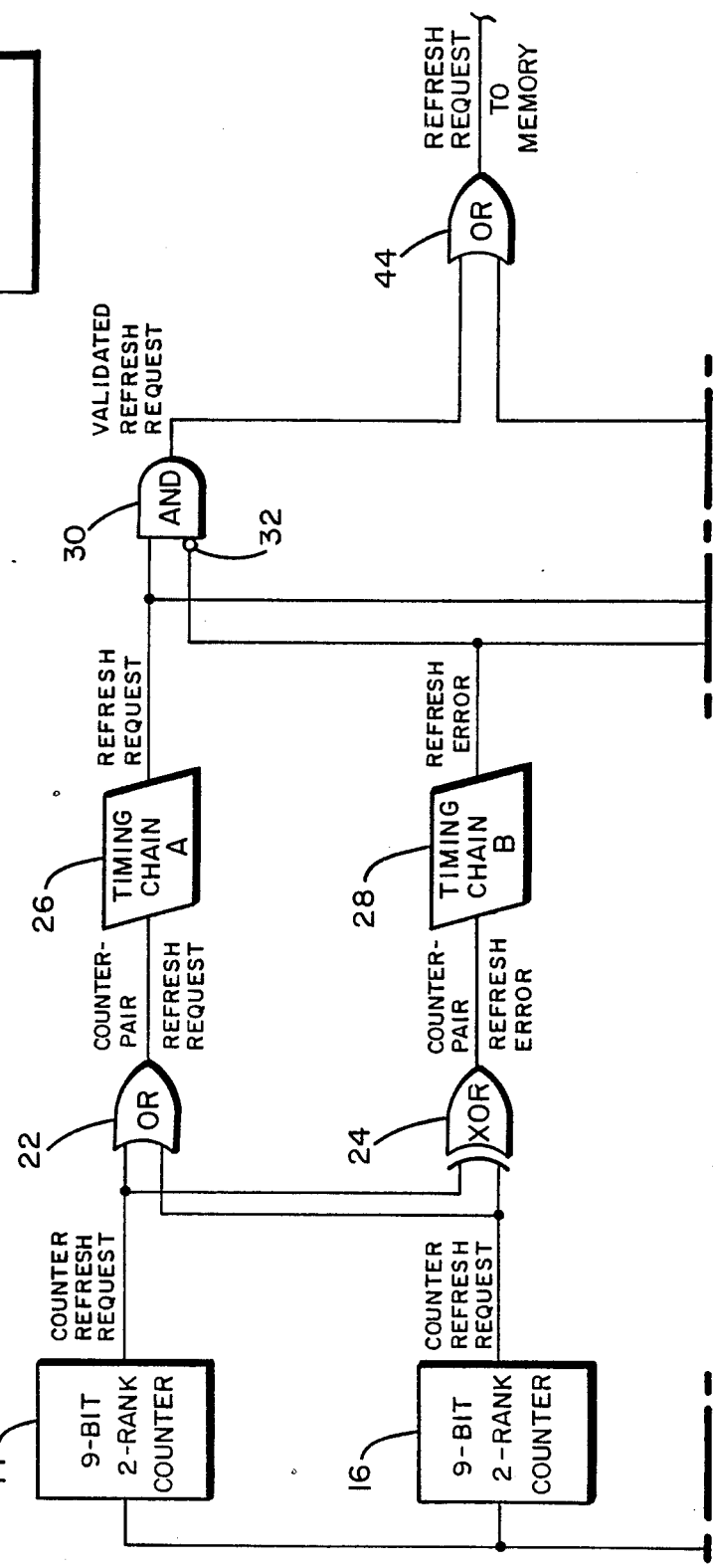

FAULT DETECTION IN MEMORY REFRESHING SYSTEM

BACKGROUND OF THE INVENTION

1. Field of the Invention

The present invention is related to the refreshing of a dynamic random access memory (DRAM), and specifically to a refreshing system in which memory banks may be refreshed continuously, even after a failure has been detected in a portion of the refresh logic.

2. General Discussion of the Background Art

Prior DRAM refresh systems have been arranged into pairs of banks, and refresh logic has been employed to refresh each of the banks through separate logic channels. In each of the logic channels there was circuitry to verify the correct operation of the refresh timing circuit associated with that particular bank, or pairs of banks. When a refresh error was detected in one refresh section that serviced one set of banks, these memory banks could shut down and operation could be continued with the remaining pairs of banks, but with a consequent reduction in memory capacity.

In the present invention, the entire memory system is considered as a unitary structure with regard to the refresh mechanism. A plurality of refresh channels are still employed. However, when a failure has been detected in one of the channels, refreshing of the entire memory continues through the other channels, while the detected error allows for replacement of the circuitry associated with the failed channel.

SUMMARY OF THE INVENTION

A DRAM refreshing system for refreshing all of the memory banks of a memory simultaneously is provided by arranging the refresh system into at least a pair of refresh channels. Each refresh channel consists of a pair of identical counters which are coupled through one type of timing chain to supply a refresh request signal, while the other counter is coupled through a second type of timing chain to supply a refresh error signal. As long as the output of the two timing chains match, a refresh request to memory signal will be coupled through an OR gate, which is operable by either of the two channels. In the event that only one of the refresh channels should fail and a refresh error signal be generated for that channel, the OR gate will continue to supply the refresh request to memory signal through the OR gate. The validated refresh request signal for the failed channel, however, will be shut off, and a refresh fault signal will be generated to indicate that one of the refresh channels have failed. In the event that both of the channels fail, the OR gate will no longer supply the refresh request to memory signal, and the refresh fault signal will be generated.

BRIEF DESCRIPTION OF THE DRAWINGS

The present invention is described by reference to the drawings in which:

FIG. 1 is a layout diagram which shows the alignment of FIGS. 1a and 1b;

FIGS. 1a and 1b together comprise an overall block diagram of the DRAM refresh system of the present invention;

FIG. 2a is an expanded block diagram of the timing chain A blocks which appear in FIG. 1a.

DETAILED DESCRIPTION OF THE INVENTION

Figure 1B:
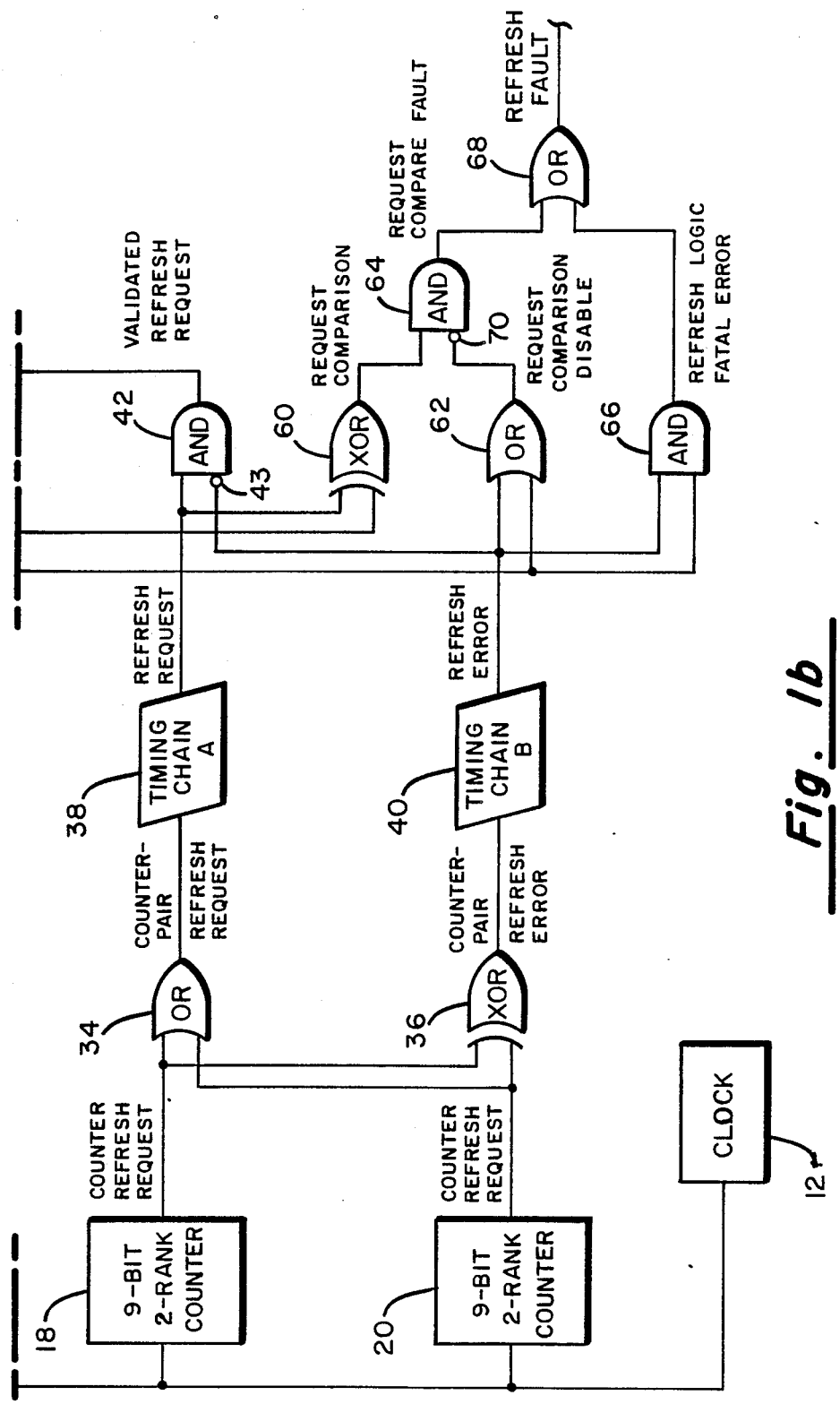

As noted in the Background of the Invention section, prior DRAM memory refresh schemes divided the memory into two or more pairs of banks, for example, odd and even pairs of banks. The odd banks were refreshed through a first refresh channel which had its own refresh error detecting circuitry. The even set of banks was also refreshed through another channel with a refresh error detecting mechanism. When a failure occurred in one of the refresh channels, the memory banks associated with that channel would be shut down, but the other channels could continue to operate.

Referring now to FIG. 1a, the block diagram of this figure shows elements 14–32 that may be utilized with the above-described type of prior art refreshing scheme. In such a prior art system, the AND gate 30 shown in FIG. 1a, however, would provide an output which represents the refresh request to memory signal for one set of memory banks, and a duplicate refresh channel would be used to supply the refresh request to memory signal to the other set of memory banks. The following description, therefore, describes common elements that might be used both in prior art type of systems and in the system of the present invention.

A digital timing clock 12 (FIG. 1b) is supplied to the inputs of the 9-bit double-rank counters 14, 16, 18 and 20, where counters 14, 16 are associated with one refresh channel and counters 18, 20 are associated with a second refresh channel. In the described embodiment of the present invention, the number of memory banks is immaterial to the operation of the invention, and thus it may be used with two sets of memory banks as in the prior system, or it may be utilized with any number of memory banks. In the prior art type systems, however, the 9-bit counters 14 and 16 would be used in the refreshing of one set of memory banks, while the counters 18 and 20 would be used in the refreshing of the other set of banks.

The counter 14 generates the counter refresh request signal after an appropriate number of clock signals have been encountered. This signal is supplied to the OR gate 22 and to the Exclusive-OR (XOR) gate 24. The counter 16 is identical to the counter 14, and supplies its own counter refresh request signal to both the OR gate 22 and the XOR gate 24. A counter-pair refresh request signal is then issued from the OR gate 22 and a counter-pair refresh error signal is provided by the XOR gate 24. In normal operation these two signals are identical.

The counter-pair refresh request signal from the OR gate 22 is supplied to the timing chain A 26. The output of the timing chain A 26 is a refresh request signal which is supplied to one input of the AND gate 30. Similarly, the counter-pair refresh error signal from the XOR gate 24 is supplied to the timing chain B 28. The timing chain B 28 provides a refresh error signal which is supplied through an inverter, which is indicated by the circle 32 on the second input of the AND gate 30.

When both of the counters 14 and 16 are operating in unison, and no failure has occurred, the output signals from these counters both provide refresh signals through the OR circuit 22, the timing chain A 26 and the AND gate 30. Thus, when both of the counters 14 and 16 produce identical output signals, the XOR circuit 24 does not produce a counter-pair refresh error signal. Because of the inverter 32 on the second input to the AND gate 30, the logic level of the refresh error signal from the timing chain B 28 will then match the logic level of the refresh request signal, and the AND gate 30 will supply a validated refresh request signal in the present invention. In the prior art type systems in which there are two separate sets of banks, the output of the AND gate 30 could be utilized to supply the refresh signal required for one of the sets of banks.

In a portion of the system shown in FIG. 1b, the OR gate 34 corresponds to the OR gate 22, the XOR gate 36 corresponds to the XOR gate 24, the timing chain A 38 corresponds to the timing chain A 26, the timing chain B 40 corresponds to the timing chain B 28, the AND gate 42 corresponds to the AND gate 30 and the inverter 43 corresponds to the inverter 32, all of FIG. 1a. Thus, the output of the AND gate 42 in the prior art system would be utilized to supply the necessary refresh signal to a second set of memory banks. In the present invention, however, the outputs of the AND gates 30 and 42 are both coupled to the OR gate 44, and the output of the OR gate produces a refresh request to memory signal which is supplied simultaneously to refresh all of the memory banks of the system.

In the operation of the circuitry of FIGS. 1a and 1b, it is seen that whenever the counters 14 and 16 differ, then XOR gate 24 will produce a counter-pair refresh error signal which will overlap in time with the counter-pair refresh request signal being produced by the OR gate 22. The outputs of the timing chain A 26 and the timing chain B 28, which are the refresh request and the refresh error signals, respectively, are compared at the AND gate 30 after the refresh error signal has been inverted by the inverter 32. Thus, when the refresh error signal is present at the same time as the refresh request signal from the timing chain A 26, the AND gate 30 will not produce an output signal due to the inverter 32.

Figure 2A:
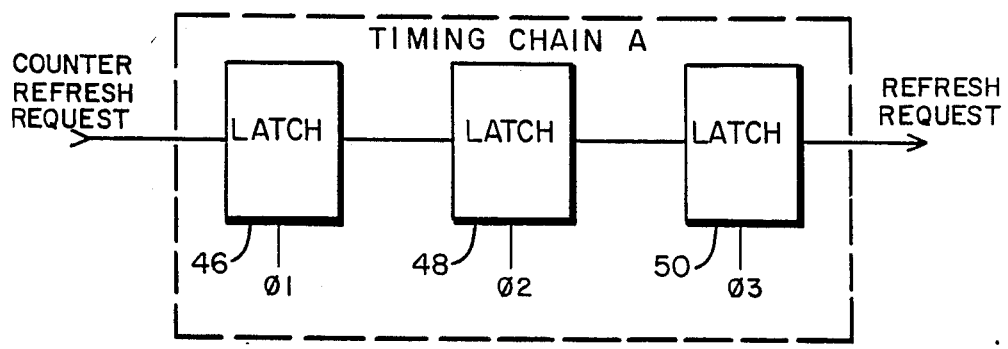
Figure 2B:
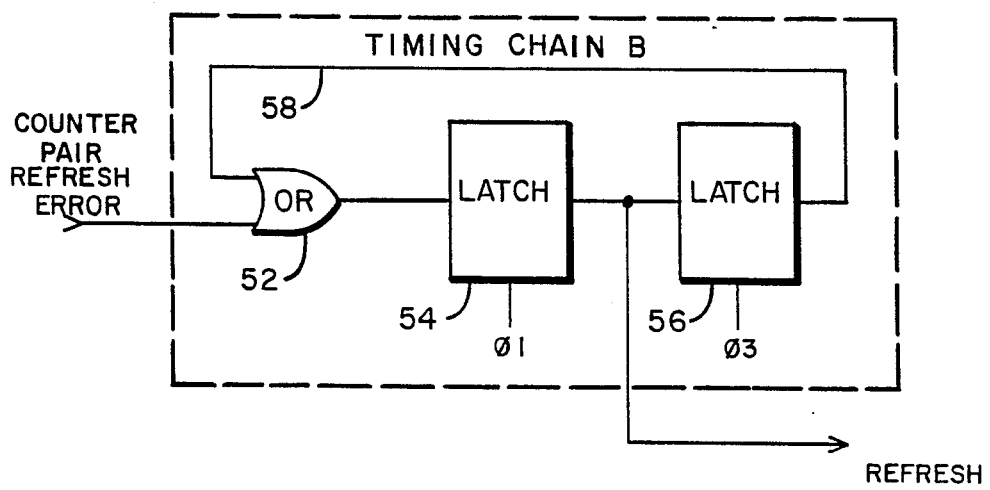
FIG. 2b is an expanded block diagram of the timing chain B blocks which appear in FIGS. 1a and 1b.

The timing chain A 26, 38 are not identical to the timing chain B 28, 40. Their differences are illustrated in FIGS. 2a and 2b. FIG. 2a shows a block diagram of a timing chain A. In a refresh system in which at least three clock phases, $\phi_1$, $\phi_2$ and $\phi_3$, are employed, the timing chain A may comprise a separate latch which is driven by each of the clock phases. For example, the latch 46 which receives the counter refresh request signal is driven by clock phase $\phi_1$. The latch 48, which is coupled to the output of the latch 46, receives clock phase $\phi_2$, and the latch 50, which is coupled to the output of the latch 48, receives clock phase $\phi_3$. The latch 48 produces the refresh request output signal that is supplied to either the AND gate 30 or the AND gate 42, according to the refresh channel in which the timing chain A is connected.

A timing chain B may include only two latches and an OR gate. The OR gate 52 receives the counter-pair refresh error signal on one input, and supplies its output to the latch 54 which is driven by the clock phase $\phi_1$. The output of the latch 54 is supplied to the latch 56, which is driven by the clock phase $\phi_3$, and this output also serves to supply the refresh error signal. The output of the latch 56 is fed back on the line 58 to the other input of the OR gate 52 so that when this latch is set, the timing chain B will latch up and will not be responsive to additional counter-pair refresh error signals.

The specific structure of the timing chains A and B is not significant in the present invention as long as the functionality of the chains are preserved. The purpose of providing the two different types of chain is to allow the timing chain B to latch up upon the occurrence of a counter-pair refresh error signal prior to the time that the refresh request signal is supplied so that a failure in the refresh channel is certain to be detected.

In addition to the coupling of the AND gates 30 and 42 to the OR gate 44, which supplies the common refresh request to memory signal, the remaining circuitry allows the present invention to detect an error in the matching of the outputs of either the pair of counters 14 and 16 or the pair of counters 18 and 20, without stopping periodic refreshing of any of the memory banks until such time that the failed components of the defective refresh channel can be repaired or replaced. If errors occur in both of the refresh channels, the entire memory will then, of course, be shut down.

The manner in which the refresh fault signal is generated in the present invention is shown in FIG. 1b. This signal is generated through the utilization of the XOR gate 60, the OR gate 62 and the AND gates 64, 66 and 68, in conjunction with the inverter 70, which is represented by the circle coupled to the lower input of the AND gate 64. The XOR gate 60 receives as inputs the refresh request signals from the timing chain A 26 and the timing chain A 38. The XOR gate 60 supplies the request comparison signal as an output.

The OR gate 62 receives the refresh error signals from the timing chain B 28 and the timing chain B 40, and supplies the request comparison disable signal. The AND gate 66 also receives the refresh error signals from the timing chain B 28 and the timing chain B 40. The AND gate 66 supplies the refresh logic fatal error signal when both of the AND gates 30 and 42 fail to supply validated refresh request signals to the OR gate 44. As mentioned above, when this occurs, the refresh request to memory signal from the OR gate 44 fails for all of the memory banks. The AND gate 66 is supplied to one input of the OR gate 68. Thus, a refresh fault output signal will occur when refresh errors have been detected in both of the refresh channels.

As long as the refresh request signals from the timing chain A 26 and the timing chain A 38 compare, whether both are operating properly or both have failed, the request comparison output signal from the XOR gate 60 will not be produced. Whenever one of the channels, however, produces a refresh request signal and the other does not, the signals will be at different levels, and the request comparison signal is produced, and is supplied to the AND gate 64. The OR gate 62 receives the refresh error signals from both the timing chain B 28 and the timing chain B 40. Therefore, the request comparison disable signal from the OR gate 62 will be present whenever an error occurs in either one or both of the refresh channels. The request comparison disable signal is inverted by the inverter 70 and is supplied to the AND gate 64. Because of the inverter 70, the refresh error signal from the timing chain B that does not match the refresh request signal of the timing chain A of the same refresh channel will cause the AND gate 64 to provide a request compare fault signal through the OR gate 68. The refresh fault signal in this instance indicates that one of the two refresh channels is defective. If the timing chain consisting of the counters 14 and 16 is at fault, the validated refresh request signal output from the AND gate 30 will be blocked. On the other hand, if the refresh channel consisting of the counters 18 and 20 is defective, the validated refresh request signal from the AND gate 42 will not be produced, and, therefore, the defective channel will be detected.

We claim:

1. A dynamic random access memory (DRAM) system for refreshing at least one DRAM module each of which comprises at least one pair of identical first and second refresh signal producing means, refresh error detection means for monitoring said first and second refresh signal producing means and for generating a first refresh error signal if said first refresh signal producing means is defective and a second refresh error signal if said second refresh signal producing means is defective, and means responsive to said first and second refresh signals and to said first and second refresh error signals for generating a memory refresh signal which is capable of refreshing said at least one DRAM module only when both of said first and second refresh error signals are not generated.

2. A DRAM refresh system as claimed in claim 1 wherein said means responsive to said first and second refresh signals and to said first and second refresh error signals comprises means for inhibiting the generation of said first or said second refresh signal whenever the associated first or second Refresh Error signal is generated.

3. A dynamic random access memory (DRAM) refresh system for refreshing at least one DRAM module each of which comprises at least first and second refresh channel means, each of which comprises signal means wherein the signal means for said first refresh channel means produces a first refresh signal and a first error signal and the signal means for said second refresh channel means produces a second refresh signal and a second error signal wherein the refresh signal and the error signal produced for a channel are identical only when an associated refresh channel means is operating properly, means coupled to said first and second refresh channel means which allows a memory refresh signal to be initiated by either of said first and second refresh channel means and which is capable of refreshing said at least one DRAM module only if said refresh and error signals are identical for the associated initiating refresh channel means.

4. A dynamic random access memory (DRAM) refresh system for refreshing at least one DRAM module as claimed in claim 3, wherein each module produces a fault signal when said refresh error signals are not identical for at least one of said first and second refresh channel means.

5. A dynamic random access memory (DRAM) refresh system for refreshing at least one DRAM module each of which comprises clock means for supplying clock pulses at least first and second refresh channel means, each of said first and second refresh channel means comprising:

first and second counter means, each coupled to receive and count said clock pulses and to supply a counter output signal after a predetermined number of counts, first circuit means coupled to receive said counter output signals from both of said first and second counter means for providing a first signal that represents a refresh request for the associated channel, second circuit means coupled to receive said counter output signals from both of said first and second counter means for providing a second signal that represents a Refresh Error for the associated channel, comparison means for comparing said first and second signals and for providing a third signal that represents a validated refresh request only when said first and second signals are the same, wherein said DRAM memory refresh system further comprises means for supplying a refresh signal to said at least one DRAM module only when said third signal is supplied by at least one of said first and second refresh channel means.

6. A dynamic random access memory (DRAM) refresh system for refreshing at least one DRAM module as claimed in claim 5, wherein each module further comprises fault detection means which is coupled to receive both of said first and second signals from said first and second refresh channel means for generating a fault signal only if said third signal is not provided, for at least one of said first and second refresh channel means.

7. A dynamic random access memory (DRAM) refresh system for refreshing at least one DRAM module as claimed in claim 6, wherein each module generates a fault signal whenever at least one of said first and second refresh error signals are generated.

* * * * *